United States Patent [19]
Dixon et al.

[11] Patent Number: 6,081,862
[45] Date of Patent: Jun. 27, 2000

[54] SWITCHING SYSTEM FOR OPTIMIZATION OF SIGNAL REFLECTION

[75] Inventors: Robert Christopher Dixon; Thoi Nguyen, both of Austin, Tex.

[73] Assignee: International Business Machines Corporation, Armonk, N.Y.

[21] Appl. No.: 09/140,171

[22] Filed: Aug. 26, 1998

[51] Int. Cl.[7] .............................. G06F 1/00; H04B 3/00
[52] U.S. Cl. .......................................... 710/127; 710/126
[58] Field of Search .............................. 710/2, 100, 101, 710/126, 129, 127; 711/115, 101, 105, 100; 713/401; 307/112; 375/354; 385/16, 71; 379/400; 365/63, 230.01; 340/825

[56] References Cited

U.S. PATENT DOCUMENTS

| | | |
|---|---|---|
| 4,002,970 | 1/1977 | Ashley et al. . |
| 4,037,066 | 7/1977 | Kiko . |
| 4,447,870 | 5/1984 | Tague et al. . |
| 5,301,278 | 4/1994 | Bowater et al. ........................ 395/275 |
| 5,513,135 | 4/1996 | Dell et al. ................................ 365/52 |
| 5,661,826 | 8/1997 | Saito et al. . |
| 5,721,860 | 2/1998 | Stolt et al. ............................. 395/432 |
| 5,727,182 | 3/1998 | Fukushima et al. .................... 395/442 |

*Primary Examiner*—Gopal C. Ray
*Attorney, Agent, or Firm*—Robert V. Wilder; Leslie A. VanLeeuwen

[57] ABSTRACT

A method and implementing system is provided which includes a switching device as part of a circuit board transmission line or trace serially connecting a plurality of device terminal sockets to a common node. When device terminals are left unconnected, corresponding segments of the connecting transmission line on the circuit board are disconnected to provide transmission line segments corresponding to the number of devices actually used. As a result, signal transition time for signals at the common node is optimized in accordance with the number of devices actually used.

11 Claims, 3 Drawing Sheets

6,081,862

SWITCHING SYSTEM FOR OPTIMIZATION OF SIGNAL REFLECTION

FIELD OF THE INVENTION

The present invention relates generally to information processing systems and more particularly to circuitry for adjusting signal propagation timing relationships within such systems.

BACKGROUND OF THE INVENTION

With the rapid advancement in memory technology, computer systems must be developed for current technologies and they must also continue to support previous technologies. For desktop and other computer systems, memory technology has advanced from DRAMs (Dynamic Random Access Memories) to SDRAMs (Synchronous DRAMs). With DRAM technology, many actuating signals for example, are generated only after earlier timing signals have been provided when the actuating signals are derived from the earlier timing signals. Accordingly, timing was not a critical consideration for most applications. However, with synchronous systems, and particularly with SDRAMs, signal propagation is accomplished in strict accordance with clock signals and all timing and actuation signals must be completed at a particular predetermined time relative to a main clock signal. Thus, with the faster synchronous systems, timing becomes extremely critical.

With reference to memory systems, it is noted that the desktop computer industry has standardized on DIMM (Dual In-line Memory Modules) devices as the basic memory component. In particular, the popular DIMM for many computer systems is the 168 pin DIMM. For DRAM DIMMS, the DIMM has pin connections or pads to receive first and second WE (Write Enable) signals from a memory controller. Most memory system implement a set or plurality of DIMMs juxtaposed on a memory card. Typically, the WE line from a memory controller on the memory card is run along a common line from the memory controller to each of the first WE pads of the DIMM set, and then continues in a common line to be connected to each of the second WE pads on the same set of DIMMs. Since the first and second WE pads are typically some distance from each other, even though this method of series connections has not been a problem for DRAM DIMMs, it has resulted in many unnecessarily long transmission lines in many computer systems. Such long transmission lines do, however, present timing problems when it is desired to upgrade such memory systems to SDRAMs. The timing requirements for SDRAMs are much tighter than they are for DRAM technology since every operation must occur synchronously with the clock signal for the memory slot.

Thus, there is a need for an improved method and implementing system for accommodating signal timing requirements for both DRAM technology as well as for the relatively faster SDRAM technology.

SUMMARY OF THE INVENTION

A method and implementing computer system is provided which includes device connector sockets or terminals connected in series by a transmission line or trace on a circuit card or circuit board or integrated circuit where the number of devices or device terminal pins connected to the connector sockets is variable. In accordance with the present invention, the length of the connecting circuit traces or transmission lines is adjusted in accordance with the number of devices or pins actually connected to the transmission line within the circuit to optimize the "reflection time" for a signal transition travelling along the transmission line and the resulting transition time between states for such signals.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
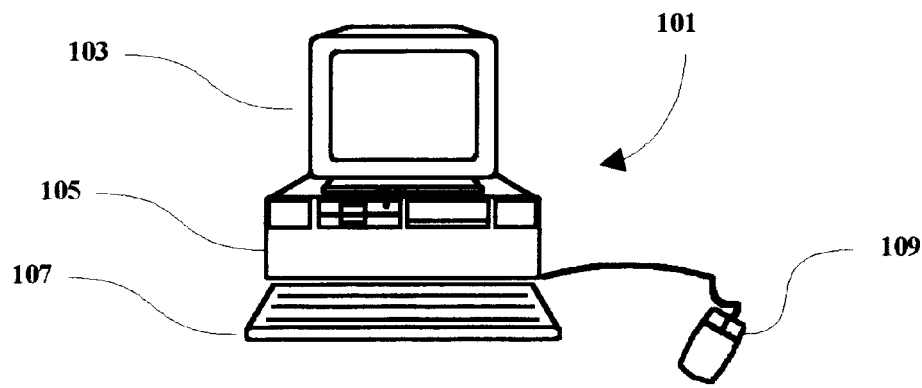
FIG. 1 is an illustration of a computer system in which the present invention may be implemented.

With reference to FIG. 1, the various methods discussed herein may be implemented within a typical computer system which may be, for example, a workstation or personal computer 101. In general, an implementing computer system may include a plurality of processors in a multi-bus system in a network of similar systems. However, since the workstation or computer system 101 implementing the present invention in an exemplary embodiment, is generally known in the art and composed of electronic components and circuits which are also generally known to those skilled in the art, circuit details beyond those shown in the drawings are not specified to any greater extent than that considered necessary as illustrated, for the understanding and appreciation of the underlying concepts of the present invention and in order not to obfuscate or distract from the teachings of the present invention.

In FIG. 1, the computer system includes a display device 103 and an electronics enclosure 103 which is typically arranged for housing one or more CPUs (central processing units) along with other component devices and subsystems of the computer system 101. Typically such component devices and subsystems are mounted on circuit boards or circuit cards within the enclosure 103. The computer system 101 also includes a keyboard 107 and a mouse or pointing device 109, which are all interconnected within the illustrated computer system.

Figure 2:
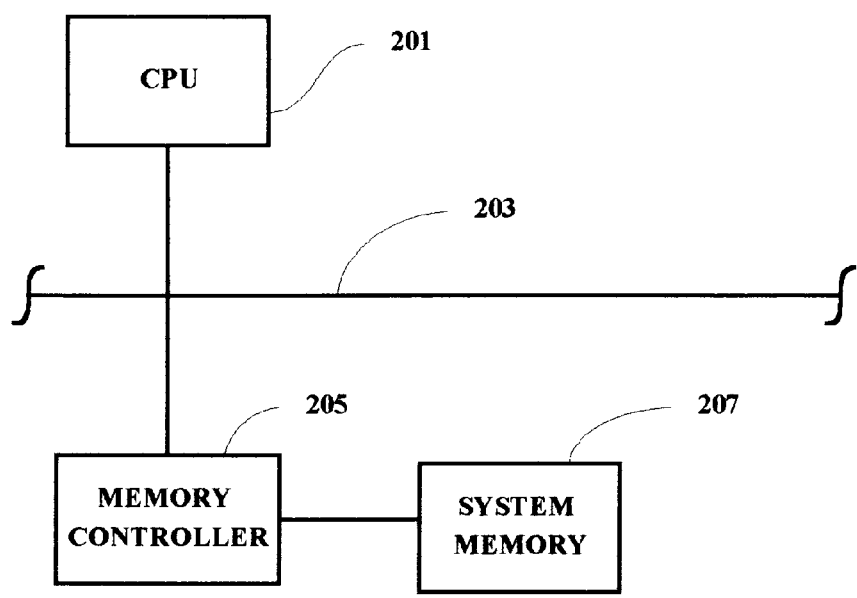
FIG. 2 is a partial schematic diagram of a computer system illustrating the memory system therein.

As shown in FIG. 2, an exemplary computer system includes one or more CPUs such as CPU 201. CPU 101 is connected to a system bus 203. Computer systems also include a memory subsystem including a memory controller 205 connected to the system bus 203. The memory controller is connected to and manages a system memory 207. Typically, the system memory 207 includes a plurality of DIMMs mounted side-by-side on a memory card which in turn is plugged into a motherboard within the enclosure 105.

Figure 3:
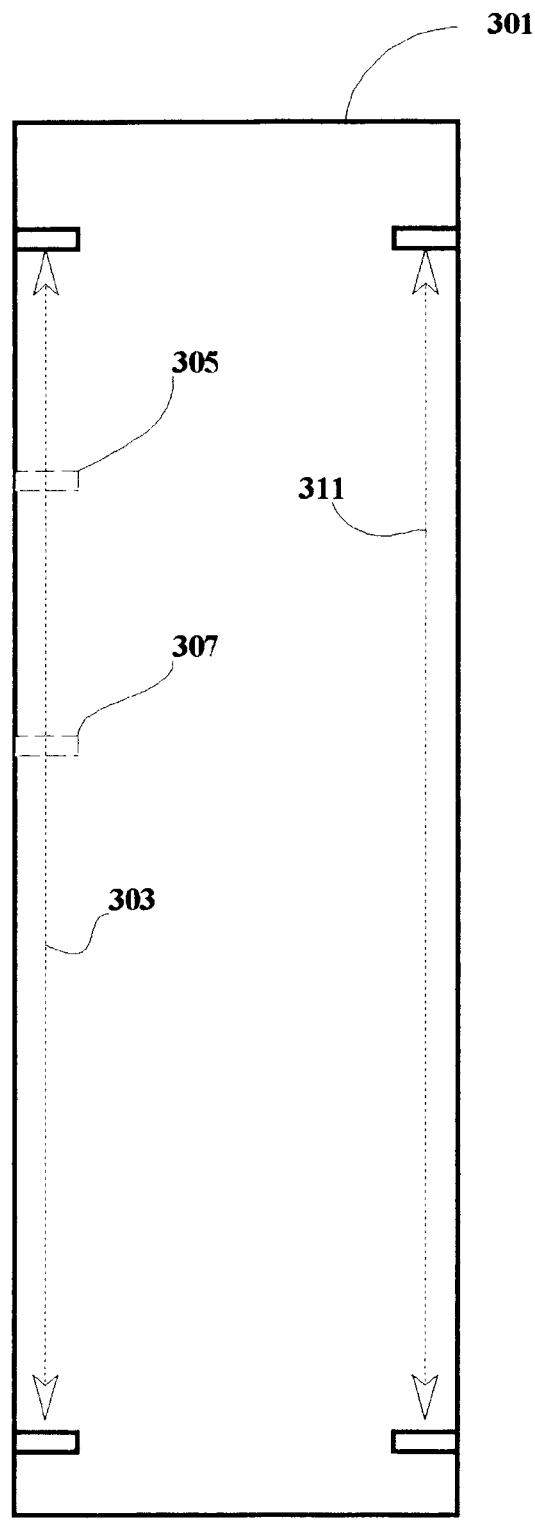
FIG. 3 is a drawing showing portions of a DIMM pin-out used to illustrate typical WE signal pad connections.

An exemplary DIMM pin-out is illustrated in FIG. 3. A DIMM device socket 301 is arranged to receive a first series 303 of DIMM connection pins along the left side of the DIMM socket 301 and to receive a second series 311 of DIMM connection pins along the right side of the DIM socket 301. The pins along the left side of the DIMM socket 301 include first and second WE pins connectors 305 and 307. For an exemplary 168 pin DIMM, the first and second pin connectors 305 and 307 correspond to pin number "27" and pin number "48" on the DIMM pin-out specification. For DRAM DIMMs, both of these pins on the DIMM are designed to be connected to the corresponding socket on a memory card, and both pins are electrically connected to the same signal trace on the memory card which is connected to a memory controller and carries the WE (Write Enable) signal as illustrated in FIG. 4.

Figure 4:
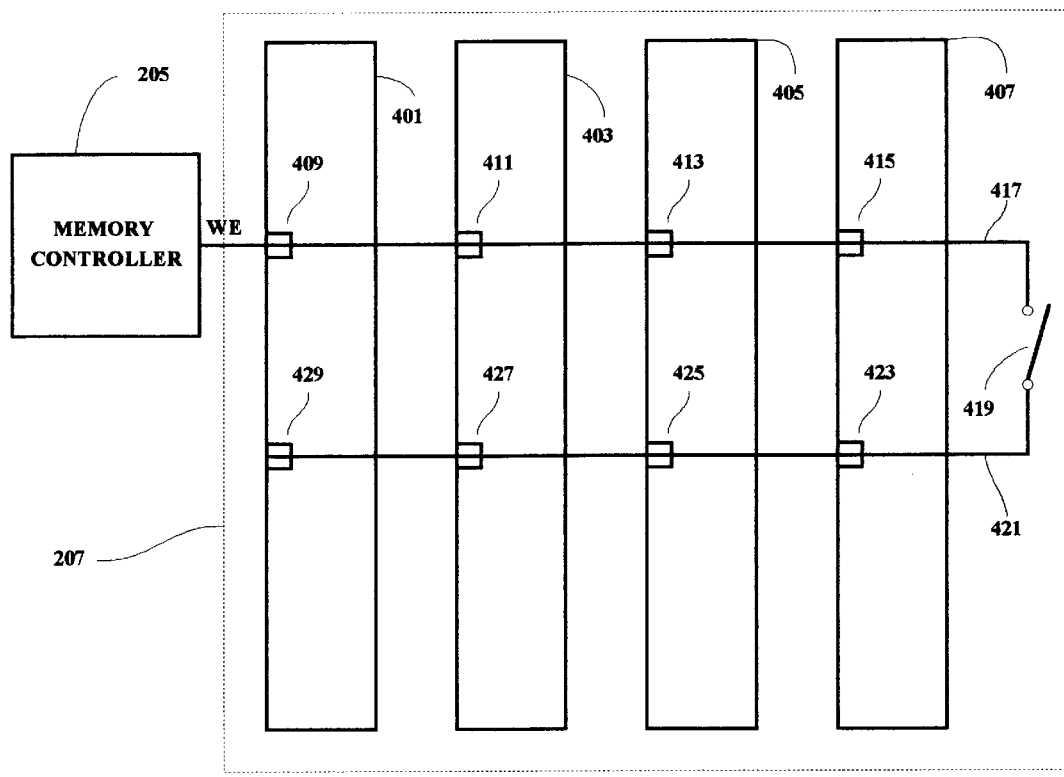
FIG. 4 is a schematic illustration showing a plurality of juxtaposed DIMM devices connected in accordance with the present invention.

As shown in more detail in FIG. 4, an exemplary arrangement includes four DIMMs 401, 403, 405 and 407 which are positioned side-by-side on a memory board 207. Each of the DIMMs 401, 403, 405 and 407 contains both first and second WE signal pins. DIMM 401 includes first and second WE pins 409 and 429, respectively. DIMM 403 includes first and second WE pins 411 and 427, respectively. DIMM 405 includes first and second WE pins 413 and 425, respectively. DIMM 407 includes first and second WE pins 415 and 423, respectively. As illustrated, the memory controller 205 applies a WE signal to a first segment 417 of a WE signal line which serially connects the first WE pins 409, 411, 413 and 415. The first segment 417 of the WE signal line is connected through a switching device 419 to a second segment 421 of the WE signal line, which, in turn is connected to the series of second WE pins 423, 425,427 and 429 of the DIMMs 407, 405, 403 and 401, respectively.

Figure 5:
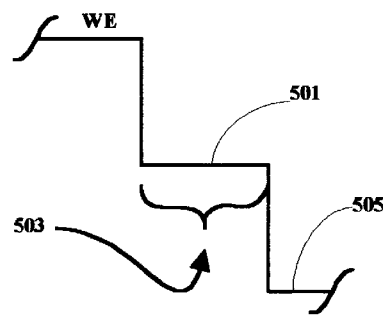
FIG. 5 is an illustration showing a WE signal as generated using DRAM technology connections, when viewed at the end of the transmission line closest to the driving end of the line, i.e. closest to the memory controller.
Figure 6:
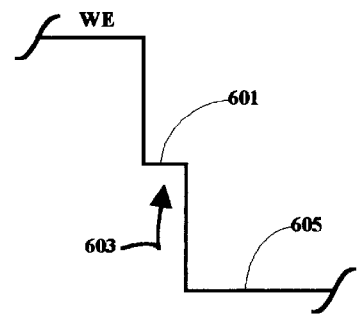
FIG. 6 is an illustration showing a WE signal as generated in accordance with the present invention, when viewed at the end of the transmission line closest to the driving end of the line, i.e. closest to the memory controller.

In operation, with DRAM technology, when the WE signal is generated by the memory controller 205, the WE signal is propagated to two WE pins in each of the four DRAM DIMMs. The WE signal as it is applied to all eight pins in a DRAM arrangement (i.e. without the switch 419) appears as illustrated in FIG. 5. A low-going edge of the WE signal first goes to a middle level potential 501 at which point the signal remains for a certain period of time 503 until the signal is "reflected" from the end of the line 421. After the "reflection" of the WE signal is completed, the WE signal continues toward its steady state low level 505. The length of time 503 that the WE signal remains at the intermediate level 501 is a function of the length of the transmission line which carries the WE signal.

With the circuit arrangement as shown in FIG. 4 but without the switch 419, when SDRAM DIMMs are "plugged-in" as the memory components 401, 403, 405 and 407, the second series of WE pins 423, 425,427 and 429 must be left unconnected. Even when using SDRAMs which do not have the second WE pin (pin #48 on the pin-out) connected, the trace or line 421 would remain in place (without the switch 419) on the memory card and represent an unnecessary transmission line segment causing the relatively extended WE signal as shown in FIG. 5. This extended signal sometimes causes timing problems in a synchronous system. However, when the switch 419 is implemented and placed in an open position as shown in FIG. 4, the second series of #48 pins 423, 425, 427 and 429 are left unconnected and the line segment 421 is also disconnected or "opened" thereby shortening the overall to length of the WE transmission line to include only the length between the memory controller 205 and the switch 419 and not the lower segment 421. In that case, the signal "reflection" time is substantially reduced and as a result, a low-going edge of the WE signal remains at an intermediate level 601 for only a brief "reflection" time 603 in transitioning to a low potential level 605. This results in a substantially "faster" WE signal having a substantially shorter transition time thereby avoiding any timing problems which might otherwise exist in implementing SDRAM DIMMs.

With the system as illustrated in FIG. 4, either DRAM or SDRAM DIMMs may be used. When DRAMs are implemented, the switching device 419 is placed in the closed position and the second series of DIMM #48 pin connectors 423, 425, 427 and 429 are connected in line with the first series of pin #27 connectors 409, 411, 413, and 415 to the WE output of the memory controller 205. When SDRAM DIMMs are plugged-in, the switching device 419 is placed in the open position and the line segment 421 is disconnected. The switching device 419 may be implemented in any one of many well known devices including a simple mechanical connector or a transistor device. The disclosed methodology may also be applied to DIMM arrangements in which the #48 pin connector is coupled directly to the #27 pin connector of the same DIMM rather than through a series connection as shown in FIG. 4. In the direct coupled arrangement, individual single pole devices may be implemented on a "per DIMM" basis or a multi-pole switching device may be implemented if it is desired to use the same type DIMM in all of the DIMM connection sockets. Further, the present invention may be applied to any circuit which includes device connectors or terminals in series on a circuit card or circuit board or integrated circuit where the number of connected devices is variable. In accordance with the present invention, the length of the connecting circuit or transmission line is adjusted in accordance with the number of devices actually connected within the circuit to optimize the "reflection time" and the resulting transition time of signals carried by the transmission line. Switching devices (not shown) may be installed, for example, after each memory device socket 401, 403, 405 and 407, and the closed or open position of each switch would be determined depending upon which memory devices were actually installed in the sockets. For example, with switching devices located after each socket, and with only the first two memory device sockets 401 and 403 having memory devices installed, the switching device following memory device socket 403 would be opened to optimize WE signal transition time relative to the installation of two memory devices.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for optimizing signal transition time on a transmission line, said transmission line being connected to a series of connection terminals, said connection terminals being arranged for being selectively coupled to a selectively variable number of connected devices, said method comprising:

determining a transmission line length required to connect said transmission line to a selected number of said connected devices; and adjusting actual length of said transmission line responsive to said determining, wherein said adjusting is accomplished through opening switching devices in said transmission line.

2. The method as set forth in claim 1 wherein said connected devices comprise memory devices.

3. The method as set forth in claim 2 wherein said memory devices comprise dual in-line memory module (DIMM) devices.

4. The method as set forth in claim 3 wherein said DIMM memory devices are comprised of synchronous dynamic random access memory (SDRAM) devices.

5. A circuit arrangement comprising:

first means arranged for selective connection to a first circuit device;

a transmission line connected to said first means, said transmission line being extended for connection to a series of connection terminals, said connection terminals being arranged for being selectively coupled to a selectively variable number of connected devices, said first circuit device being selectively operable for transmitting a first signal along said transmission line to said connected devices; and at least a first switching device serially connected in said transmission line, said first switching device being selectively operable to disconnect unused segments of said transmission line.

6. The circuit arrangement as set forth in claim 5 wherein said first switching device is positioned between predetermined ones of said connection terminals.

7. The circuit arrangement as set forth in claim 5 and further including a plurality of switching devices positioned at predetermined locations between predetermined ones of said connection terminals.

8. The circuit arrangement as set forth in claim 7 wherein said plurality of switching devices corresponds to said series of connection terminals.

9. The circuit arrangement as set forth in claim 8 wherein one of said plurality of switching devices is positioned after each of said connecting terminals.

10. The circuit arrangement as set forth in claim 5 wherein said connected devices comprise memory devices and said first circuit device comprises a memory controller device.

11. The circuit arrangement as set forth in claim 10, said connection terminals comprising dual in-line memory module (DIMM) device connectors capable of being selectively connected to dynamic random access memory (DRAM) devices and synchronous dynamic random access memory (SDRAM) devices.

* * * * *